United States Patent [19]

Schulz

[11] Patent Number: 4,894,750

[45] Date of Patent: Jan. 16, 1990

[54] HOLDER FOR DISPOSING AN ELECTRICAL COMPONENT ON A HOUSING

[75] Inventor: Joachim Schulz, Amorbach, Fed. Rep. of Germany

[73] Assignee: Aurora Konrad G. Schulz GmbH & Co., Mudau/Odenwald, Fed. Rep. of Germany

[21] Appl. No.: 239,182

[22] Filed: Aug. 31, 1988

[30] Foreign Application Priority Data

Sep. 1, 1987 [DE] Fed. Rep. of Germany ... 8711826[U]

[51] Int. Cl.⁴ .......................... H05K 7/20; H05K 7/02
[52] U.S. Cl. ..................................... 361/383; 361/380; 361/417; 361/419
[58] Field of Search ............... 200/295, 296; 248/27.1, 248/27.3; 361/331, 380, 383, 384, 417, 419–420, 427

[56] References Cited

U.S. PATENT DOCUMENTS

| | | | |
|---|---|---|---|
| 4,227,238 | 10/1980 | Saito | 361/417 |
| 4,386,251 | 5/1983 | Oyama | 248/27.1 |
| 4,764,847 | 8/1988 | Eisenblätter | 361/417 |

Primary Examiner—Gregory D. Thompson
Attorney, Agent, or Firm—Becker & Becker, Inc.

[57] ABSTRACT

A holder for an electrical component, such as a resistor, that receives an air flow. The holder is elongated, and in the region where it receives flow has a round cross-sectional shape. The ends of the holder extend into openings in the component. The central portion of the holder has an essentially U-shape and is held in a guide that is associated with a housing.

17 Claims, 2 Drawing Sheets

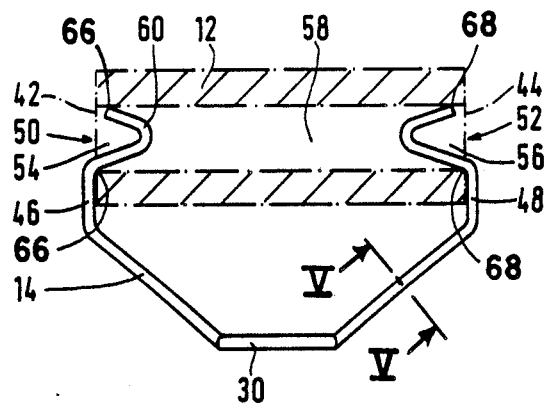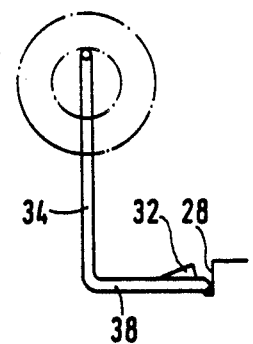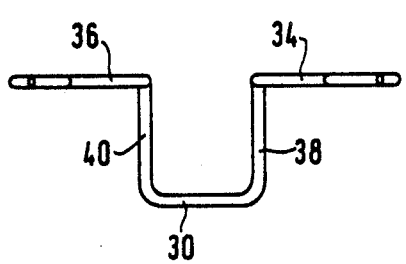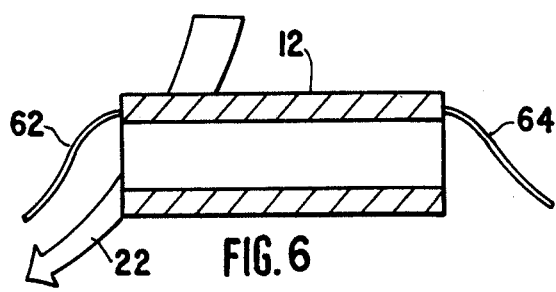
FIG. 2　　FIG. 3　　FIG. 4　　FIG. 5A　　FIG. 5B　　FIG. 6

HOLDER FOR DISPOSING AN ELECTRICAL COMPONENT ON A HOUSING

BACKGROUND OF THE INVENTION

The present invention relates to a holder for disposing an electrical component, especially a cylindrical component such as a resistor which is adapted to receive an air flow, on a housing.

A frequent problem with electrical components, such as resistors, is that a resistor that in all operating states can deliver the dissipation that occurs is relatively large, heavy, and expensive. It is therefore customary with high-output resistors to secure the latter at a distance from the part that carries the resistor, such as, for example, was frequently the case with tube-type television sets. However, as the pertaining component becomes increasingly warm, the convection also increases, so that as a result in automatic control of the temperature occurs. In addition, by mounting the components at a distance the parts that carry the resistors are not damaged by the heat given off thereby.

With resistors that are to be cooled in an air flow, the previously described automatic regulating effect does not take place. Although the resistors can be smaller and hence lighter, since a forced cooling is effected by the air flow, if a fan, in the intake region of which the electrical component could be mounted, is more greatly loaded due to increase in the current resistance, the flow speed drops at the component, just when a greater cooling effect is needed.

Therefore, in order to be able to withdraw the heat given off by the resistor in an at least somewhat more uniform manner, such components are often secured to the part that carries the resistor, and that is, for example, the housing of a motor, via brackets or plates of relatively rigid metal.

In contrast, it is an object of the present invention to provide a disposition of an electrical component on a housing in such a way as to combine flow, thermal, and mechanical advantages.

SUMMARY OF THE INVENTION

The holder of the present invention is characterized primarily in that it is elongated, with that portion which the air flow first reaches having a round cross-sectional shape; the ends of the holder extend into openings of the component, while the essentially U-shaped central portion of the holder is held in at least one guide means that is associated with the housing. As a result of the elongated configuration of the inventive holder, it is first of all possible to dispose the component in the air flow at such a distance from the housing that the circulation, and hence the cooling effect, are improved relative to bracket-cooled components. It has been shown that even with very heavily loaded fans, in the intake region of which the resistor is disposed, an automatic control of the heating occurs in that the convection and the thermal radiation contribute to an increased extent to the surrender of heat.

In order to achieve this effect, however, the holder must have a stream-lined configuration, so that the holder does not obstruct the exiting air, as was the case with the heretofore known brackets. For this purpose, that portion of the holder which the air flow first reaches has a round cross-sectional shape, whereas where the air exits, the holder has either a drop-like shape or also a round cross-sectional shape.

Pursuant to one preferred embodiment of the present invention, the holder is embodied as a wire having a circular cross-sectional shape, with the flow characteristics of this wire being optimum for the present application. With the inventive construction of the holding means, it is possible to absorb not only the standard required nine times the acceleration due to gravity, but also the vibrations that occur during operation of the fan.

On the one hand, the elongated holder can absorb the vibrations better than can the bracket, which transmits these vibrations practically undamped to the resistor, which, since it is made of ceramic, can easily break as a result. By disposing the component transverse to the air flow, and as a consequence of the inventive round and elongated holders, a relatively large surface area of the component is available to receive air flow, and a relatively small surface area of the holder stands in the way of the air flow. A large surface area for the component is, of course, necessary in order to obtain an adequate cooling effect.

With the indicated features, the component is therefore flow-wise and mechanically optimally secured. The holder is preferably embodied as a round steel wire that is very thin, so that the resistance to flow is slight, with the wire having a strength that is adequate enough to hold the resistor in its position.

It has even been shown that a slight oscillation of the resistor, as can be achieved with the inventive holder, is advantageous for the cooling, since under such conditions the apparent surface area available for the flow is increased. However, a slight oscillation is introduced by the vibration of the housing of the fan into the resistor.

Surprisingly, the cooling is also improved if the leads of the resistor itself are utilized for the securement, although with metallic housings this is not readily possible without expensive insulating measures. This is so because the leads are generally rather short and thicker in relation to their diameter, since they are made of copper and for safety reasons must additionally be provided with a PVC coating. With high-voltage insulated ballast resistors, the lead has nearly five times the diameter of the inventive holder.

It is particularly advantageous for the assembly and replacement of melted resistors to secure the central portion of the holder in a guide notch in the housing via two stops. The guide notches are of such a size that the central portion cannot break away even if the holder is deformed due to oscillations, so that the required nine times the acceleration due to gravity can be absorbed by the stops in the housing in cooperation with the guide notch. By slightly bending the ends of the holder, the component can be removed and replaced, in which connection however the spring pre-loading of the holder should not be adversely affected.

Assembly is effected without a screw coupling, with the central portion of the holder being easily introduced into the guide notch. The counterstop is either a stop device that acts upon the lower U-leg, or is a projection on that part of the housing that is not provided with the guide notch, this being for the situation where the housing is in two parts. With such an embodiment, during assembly of the housing, the holder, and hence the component, are also arrested at the same time.

Furthermore particularly favorable are the angled sections of the free ends of the holder; these angled sections permit the component to be positively held in all operating states, in other words even at the moment of greatest acceleration. The ratio of the pre-loading force to the holding force can be set by the angle of the angled sections.

If desired, with a cylindrically hollow component the angled section can be provided with such a shape that it is disposed within the hollow space of the component, so that the extreme end of the holder is again directed outwardly, or alternatively the cylindrical part is merely embraced by the angled section, so that the extreme end of the holder is directed inwardly.

It is particularly advantageous if the exposed portions of the holder that are in the air stream extend from the guide notch at an angle of approximately 45° outwardly to the end faces of the component. This provides assembly and flow advantages due to the relatively narrow guide notch. As a result of this configuration, the component is mounted in a very stable manner specifically in the direction of the axis of the figure of the component, i.e. in the longitudinal direction of the cylindrical resistor. However, pursuant to one preferred embodiment of the present invention, impellers or fan wheels are disposed directly adjacent the component in the extension of the axis of the figure of the component; in no case must the component be allowed to reach the fan wheels.

Further specific features of the present invention will be described in detail subsequently.

BRIEF DESCRIPTION OF THE DRAWINGS

This object, and other objects and advantages of the present invention, will appear more clearly from the following specification in conjunction with the accompanying schematic drawings, in which:

FIG. 2 is a front view of a holder in an inventive disposition similar to that of FIG. 1;

FIG. 3 is a side view of the inventive holder of FIG. 2;

FIG. 4 is a plan view of the inventive holder of FIG. 2;

FIGS. 5A and 5B show two possible cross-sectional shapes as taken along the line V—V in FIG. 2; and FIG. 6 shows one possible layout for the electrical leads of a component.

DESCRIPTION OF PREFERRED EMBODIMENTS

Figure 1:
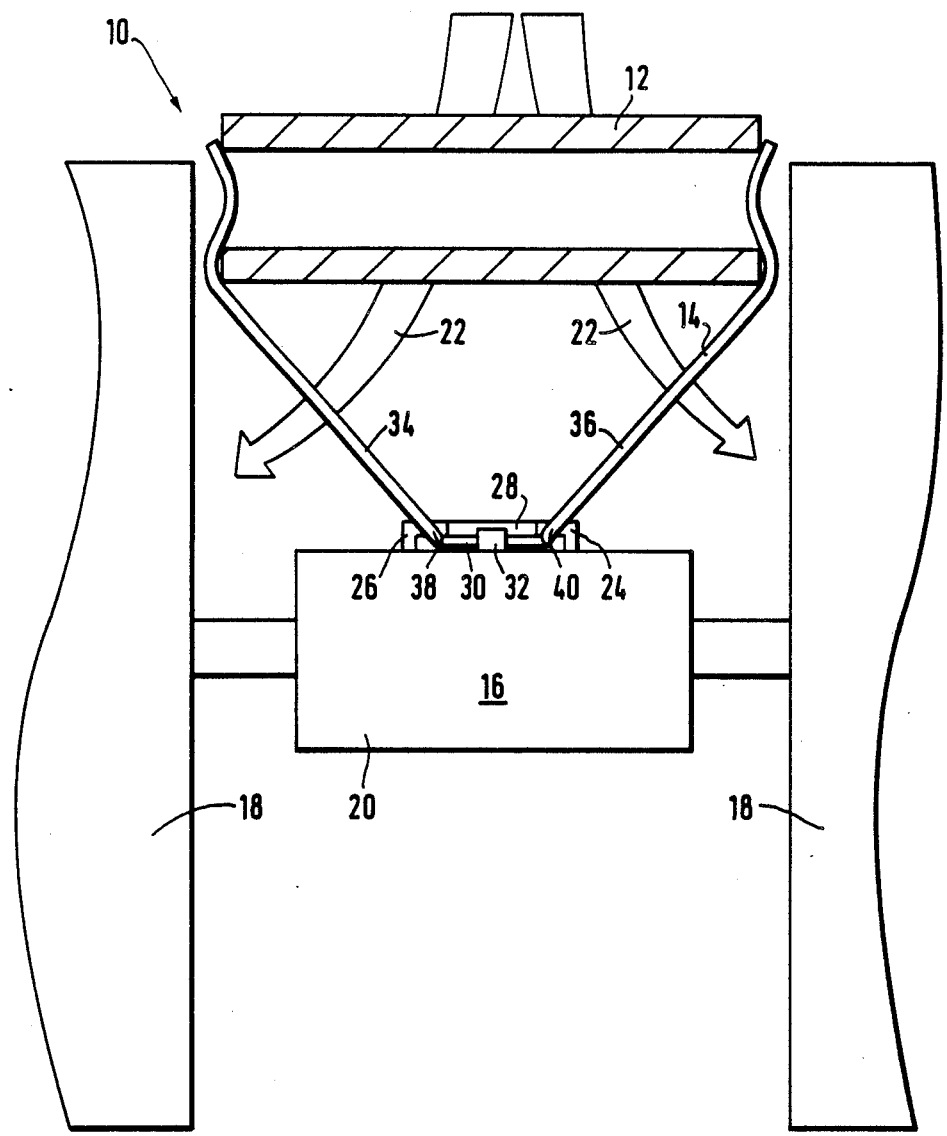
FIG. 1 illustrates one exemplary embodiment of the inventive disposition.

Referring now to the drawings in detail, the disposition 10 illustrated in FIG. 1 comprises a component 12 that is held on a housing 16 via a holder 14. The disposition 10 is part of a fan, which in the drawing is illustrated as a double radial fan 18 of known construction having an internally located motor 20. A stream of air having a direction of flow indicated by the arrows 22 passes at an angle from above by the component 12, which is thereby cooled by the air stream. In the illustrated embodiment, the housing 16 is constructed as a single piece and is provided with guide notches 24 and 26 into which the holder 14 can be inserted in the direction of the drawing sheet. The guide notches 24 and 26 are open on one side, with their other end being delimited by an abutment or stop 28 against which the lower leg 30 of the U-shaped central portion of the holder 14 rests. The lower leg 30 is held between the stop 28 and a stop device 32 that has a first inclined surface for the introduction of the holder 14 into the guide notches 24 and 26, and a further abutment surface that faces the stop surface 28. A schematic side view of the stop device 32 and the abutment or stop 28 is illustrated in FIG. 3.

The guide notches 24 and 26 extend over nearly the entire length of the U-shaped portion of the holder 14. In the vicinity of the free ends of the guide notches 24 and 26, the holder 14 is bent upwardly and to the side by about 90°, and is provided with exposed portions 34 and 36 that are disposed in the air flow and extend at an angle of about 40° upwardly and outwardly. In this connection, the exposed portions 34 and 36 are about twice as long as the lower leg 30 and the side legs 38 and 40 of the U-shaped portion of the holder 14. The exposed portions 34 and 36, if projected, could extend at an angle of about 90° to 100° relative to one another.

Securement of the component 12 to the inventive holder 14 will now be described in conjunction with FIG. 2. The same reference numerals are used in all of the figures for like parts. The exposed portions 34 and 36 extend to the end faces 42 and 44 of the component 12. At this location, the holder 14 is bent upwardly by about 50° and is provided in the region of the end faces 42 and 44 with longitudinal holding portions 46 and 48, the inner surfaces of which rest against the end faces 42 and 44, and which hold the component 12 in the direction of the axis of the figure. The component 12 has a hollow cylindrical contour. Angled sections 50 and 52 at the free ends of the holder 14 enter into openings 54 and 56 that delimit a hollow space 58 within the component 12. Outer surfaces 66 and 68 of the angled sections 50, 52 of the holder 14 rest against the openings 54, 56 of the component 12. Possible cross-sectional configurations of the exposed portions 34 and 36 of the holder 14 are illustrated in FIGS. 5A and 5B. Pursuant to FIG. 5A, the holder 14 has a round cross-sectional shape, whereas pursuant to FIG. 5B, the holder has a aerodynamic drop-like shape. In the possible layout for the electrical leads of a component as shown in FIG. 6, the leads 62 and 64 extend laterally from the component 12, extending essentially in the direction of the air flow 22.

In the illustrated embodiment, the angled sections 50 and 52 comprise two bent portions of the holder 14, which is embodied as a round spring steel wire. The first bent portion extends inwardly into the hollow space 58 at an angle of about 70° from the longitudinal holding portion 46, and the second bent portion 60 extends at an angle of about 130°, i.e. at an angle of about 60° relative to the first bent portion, so that the last end portion of the holder 14 is directed outwardly away from the hollow space. As a result of the acute-angled bent portion 60, the holding force can be greater than the pre-loading force of the holder 14, with which pre-loading force the end faces 42 and 44 are pressed against the longitudinal holding portions 46 and 48.

FIG. 3 shows the two inventive stops, with one stop being embodied as the stop device 32. The U-shaped central portion of the holder 14 with the side leg 38 is bent by about 90° relative to the exposed portion 34.

Alternatively, in place of the stop device 32, the second stop can be provided on the exposed portion 34 near the bend to the central portion, with a nose, catch, or projection of a further part that is fixed to the housing resting there, so that the holder 14 is secured in position relative to movements in all directions.

FIG. 4 is a plan view showing the symmetrical configuration of the holder 14. Also recognizable is that the U-shaped central portion is considerably smaller than the overall size of the component 12.

The position of the inventive holder illustated in FIGS. 2 to 4 is the pre-loaded position in the mounted state. The inventive holder 14 has a pre-loading of the order of magnitude of 20 Newtons, with this pre-loading acting on the longitudinal holding portions 46, 48 and pressing the end faces 42 and 44 together. The pre-loading is produced either by the insertion of the holder into the guide notches, or by the basic bending of the holder, which is made of spring steel.

If necessary, the component 12 can be removed from the holder 14 without having to disconnect anything; however, in the embodiment illustrated in FIG. 2 this is not possible due to the depth of the angled sections 50 and 52.

The present invention is, of course, in no way restricted to the specific disclosure of the specification and drawings, but also encompasses any modifications within the scope of the appended claims.

What I claim is:

1. A holder disposing an electrical component, especially a cylindrical component such as a resistor which is adapted to receive an air flow, on a housing, the improvement wherein:

said holder is elongated, with that portion which the air flow would first reach having a round cross-sectional shape, said holder furthermore having an essentially U-shaped central portion and two ends, with said ends extending into openings of said component, and with said central portion being held in guide means of said housing.

2. A holder according to claim 1, in which said guide means has a longitudinal direction, and said housing is provided with two stop means, for said holder, that act in said longitudinal direction of said guide means, with said stop means including a first stop member as a fixed abutment, and a second stop member as a stop device.

3. A holder according to claim 1, in which said holder is resiliently pre-loaded.

4. A holder according to claim 1, in which said ends of said holder, remote from said central portion thereof, are bent to form angled sections which extend under pre-load into said openings of said component, with said angled sections having outer surfaces that rest against said component on opposite sides thereof.

5. A holder according to claim 4, in which said angled sections are bent at an acute angle.

6. A holder according to claim 1, in which said component has two end faces that are held by said holder, and in which said holder has exposed portions that are adapted to extend into the air flow, with said exposed portions extending from said central portion at an angle relative to one another.

7. A holder according to claim 7 in which said angle is in the range of 90° to 100°.

8. A holder according to claim 6, in which said exposed portions of said holder are disposed in a first plane and said central portion is disposed in a second plane, with said exposed portions being disposed at an angle to said central portion.

9. A holder according to claim 8, in which said exposed portions are angled off at approximately right angles from said central portion.

10. A holder according to claim 1, in which said component is cylindrical and has a central axis that extends transverse to the air flow.

11. A holder according to claim 1, in which said component has electrical leads that extend laterally from said component essentially in the direction of the air flow.

12. A holder according to claim 1, in which said holder has a round cross-sectional shape.

13. A holder according to claim 12, in which said holder is a wire of spring steel with a circular cross-sectional shape.

14. A holder according to claim 1, in which said holder has an aerodynamic shape.

15. A holder according to claim 2, in which said stop means are respectively provided on different parts of said housing.

16. A holder according to claim 1, in which said openings of said component have a diameter that corresponds substantially to the diameter of said ends of said holder.

17. A holder according to claim 1, in which said guide means of said housing is embodied as at least one guide notch.

* * * * *